US008318878B2

(12) United States Patent
Sudo et al.

(10) Patent No.: US 8,318,878 B2
(45) Date of Patent: Nov. 27, 2012

(54) BENZOXAZINE-CONTAINING FORMULATIONS POLYMERIZABLE/CURABLE AT LOW TEMPERATURE

(75) Inventors: Atsushi Sudo, Tokyo (JP); Takeshi Endo, Yokohama (JP); Andreas Taden, Duesseldorf (DE); Rainer Schönfeld, Duesseldorf (DE); Thomas Huver, Duesseldorf (DE)

(73) Assignee: Henkel AG & Co. KGaA, Duesseldorf (DE)

( * ) Notice: Subject to any disclaimer, the term of this patent is extended or adjusted under 35 U.S.C. 154(b) by 338 days.

(21) Appl. No.: 12/442,298

(22) PCT Filed: Sep. 18, 2007

(86) PCT No.: PCT/EP2007/059814
§ 371 (c)(1),
(2), (4) Date: Jan. 19, 2010

(87) PCT Pub. No.: WO2008/034814
PCT Pub. Date: Mar. 27, 2008

(65) Prior Publication Data
US 2010/0144964 A1 Jun. 10, 2010

(30) Foreign Application Priority Data
Sep. 21, 2006 (EP) .................................... 06019761

(51) Int. Cl.
C08F 26/06 (2006.01)
C08J 3/20 (2006.01)
(52) U.S. Cl. ..................... 526/258; 427/385.5; 502/161; 524/612; 528/409
(58) Field of Classification Search .................. 526/258; 524/612; 528/409; 427/385.5; 502/161
See application file for complete search history.

(56) References Cited

U.S. PATENT DOCUMENTS

| 3,424,815 | A | | 1/1969 | Cannell et al. |
| 3,640,989 | A | | 2/1972 | Throckmorton |
| 3,694,410 | A | | 9/1972 | Oehmke |
| 4,628,077 | A | | 12/1986 | Desmond et al. |
| 5,200,452 | A | * | 4/1993 | Schreiber ...................... 524/398 |
| 5,292,859 | A | | 3/1994 | Ford et al. |
| 5,476,716 | A | | 12/1995 | Gallo |
| 6,376,080 | B1 | | 4/2002 | Gallo |

FOREIGN PATENT DOCUMENTS
JP 09291145 11/1997

OTHER PUBLICATIONS

Hsu et al. ("Synthesis of polyethercarbonate from carbon dioxide and cyclohexene oxide by yttrium-metal coordination catalyst", Polymer vol. 42 (2001), 5143-5150).*
Kaneyoshi, H., et al.; "Radical (Co)polymerization of Vinyl Chloroacetate and N-Vinylpyrrolidone Mediated by Bis(acetylacetonate)cobalt Derivatives"; Macromolecules, vol. 30, p. 2757-2763, 2006.
Inoue, S.-I., et al.; "Efficient Cobalt Complex on the Reaction Between Isophorone Diisocyanate and Diethylene Glycol"; Polymer Journal, vol. 37, No. 5, p. 380-383, 2005.
Hsu, T.-J., et al.; "Synthesis of Polyethercabonate From Carbon Dioxide and Cyclohexene Oxide by Yttrium-Metal Coordination Catalyst", Polymer, vol. 42, p. 5143-5150, 2001.
Foll, G.E., "Metal Alkyls and Metal Alkyl/Metal Chelate Reaction Products As Catalysts For Olefin Oxide Polymerisation and Copolymerisation", S.C.I. Monograph, Society of Chemical Industry, vol. 26, p. 103-130, 1967.
Ihara, E., et al., "High Polymerization of Methyl Methacrylate With Organonickel/MMAO Systems", Journal of Polymer Science: Part A: Polymer Chemistry, vol. 38, p. 4764-4775, 2000.
Wang, F., et al., "Photopolymerization of Epoxides With Platinum(II) Bis(acetylacetonato)/Silate Catalysts", Macromolecules, vol. 34, p. 6202-6205, 2001.
Wu, X., et al., "Photoactivated Ring Opening Polymerization of 1,1,3,3-Tetramethyl-1,3-Disilacyclobutane B Platinum(II) β-Diketonates", Polmer Preprints, vol. 41, No. 1, p. 494-495, 2000. XP002477990.

* cited by examiner

Primary Examiner — Ling Choi
Assistant Examiner — Chun-Cheng Wang
(74) Attorney, Agent, or Firm — Steven C. Bauman (57) ABSTRACT

The present invention relates to a catalyst, which is an organic component with electron withdrawing substituents and to compositions with such catalyst and at least one benzoxazine component, and the use of such compositions in adhesives, sealants and coatings.

14 Claims, 1 Drawing Sheet

BENZOXAZINE-CONTAINING FORMULATIONS POLYMERIZABLE/CURABLE AT LOW TEMPERATURE

The present invention relates to a novel polymerization catalyst and compositions comprising at least that catalyst, which is a fluoro-organic component and at least one benzoxazine component, and the use of such compositions in adhesives, sealants and coatings.

Electronic devices such as circuit boards, semiconductors, transistors, and diodes are often coated with materials such as epoxy resins for protection. Such coating materials are often cured on the surface of an electronic device by heat. But electronic devices often are sensitive to heat, and too much heat may adversely affect the performance of a device. It is also a problem in practice that a lot of energy is necessary for heating and/or the time which is necessary for polymerization and curing reaction is too long.

Further, if the coating material shrinks or expands significantly in response to heat, the device it coats may be warped. Thus, it is desirable to develop methods for curing coating materials at relatively low temperatures in short time periods and to develop coating materials that have a near-zero volume change upon heat treatment so as to minimize the possiblities of damaging the coated devices. Therefore it is an ongoing effort in research departments to look for ways to reduce the temperature and improve the polymerization step.

It is known that acidic catalysts can contribute to solve the above mentioned problems. Acids may be relatively efficient polymerization catalysts. Depending on their amount it may be possible to reduce the temperature and improve the polymerization step.

However, in practical applications, such strong acids also may negatively contribute to the final polymerization result and it's practical properties. For example deterioration of chemical resistance and physical properties of the cured material may appear.

Therefore it is a special intention of the present invention, to achieve good polymerization results with alternative innovative catalysts.

Looking at the organic sulfonic acids, those are relatively efficient catalysts. Organic sulfonic acid can catalyze a smooth polymerization process at acceptable temperature. Otherwise it might be that the quality of the polymerization product and/or the cured material would have negative impact on the final product. This might lead to increased corrosion or further negative effects caused by the acid catalyst. Therefore, in practical applications it is highly demanded to develop alternatives for existing catalysts like such strong acids.

Lewis acids such as $PCl_5$, $TiCl_4$, $AlCl_3$ are also known as highly active catalysts and may be used for such low temperature polymerization, too. However they are highly sensitive to moisture and cause formation of volatile, toxic, and corrosive impurities, which often makes the man skilled in the art to avoid their practical use.

Therefore it is also a target of the present invention to make available catalyst-components, by which the polymerization/curing reaction can be carried out without caution to decomposition of the catalyst-component and resulting evolution of toxic and/or corrosive by-products.

Therefore it is an object of the present invention to make available a polymerization catalyst, which is a good performing alternative to existing catalysts.

This object is solved by a polymerization catalyst according to formula I (I)

wherein n=1, 2, 3 or 4, preferably 2 or 3 and $E^1$ as well as $E^2$ are electron withdrawing substituents, R is a hydrogen or linear or branched substituted or non substituted alkyl group with 1 to 20 C-atoms, or an aryl- or hydroxyl-group or an ether bridged alkyl chain, preferably with a carbon number of less than 12 or halogen such as F, Cl or Br and Metal is selected from the group of all metals which are capable of forming metal:ligand complexes and $$2x+1=y+z, \text{ and}$$

$$2x'+1=y'+z'.$$

Under the substituent E the present invention understands all kind of electrone withdrawing substituents. Whereas $E^1$ and $E^2$ may be identical or different. According to the present invention this relates to all substituents having a (−I) and/or (−M) effect. Examples without restricting the scope to those groups are all types of nitrate, sulphate, sulphonic, halogenic, carbonate, carboxylate, formate, aldehyde, keto, acetal, and further groups. In one preferred embodiment of the present invention the substituent E has a (−I) and a (+M) effect. It is also preferred according to the present invention to have at least one electrone withdrawing substituent, which is a monovalent substituent. It is most preferred according to the present invention if E is selected from the group of halogenic elements, in particular if E is F.

It is also preferred if $E^1$ and $E^2$ are identical.

The preferred metal centers (Metal) are selected from manganese (Mn), iron (Fe), and cobalt (Co). Nevertheless also further metal centers which show metal:ligand complexing properties like those specific metals fall under the scope of this invention. In particular metals in the transition group of the periodic system metals which are capable of forming metal:ligand complexes are preferred for the purpose of the present invention.

Examples are metals like Fe, Co, Ni, Cr, Mo, W, V, Nb, Ta, Ti, Zr, Hf, In, Mn, Cu, Zn, Cd. The most preferred metals in the view of the present invention are selected from manganese (Mn), iron (Fe), and cobalt (Co).

It has also to be mentioned that y and y' or z and z' may also be 0, whereas it is preferred that x<4, x'<4, z>y, z'>y'. In particular it is preferred that y=y'=0 and R=H.

Some examples of such catalysts are:

-continued

In a preferred embodiment the catalysts according to the present invention may be combined with further catalytic components, in particular nitrogen containing heterocycles and/or organic sulfonic acids, preferably in low amounts.

If nitrogen containing heterocycles are combined these can be saturated, unsaturated, or aromatic. Besides heterocycles like imidazoles it may also be preferred that these nitrogen containing heterocycles are a thiazole, an oxazole, an imidazole, a pyridine, a piperidine, or a pyrimidine, a piperazine, a pyrrole, an indole or a benzthiazolyl. It is further on preferred that there is no acidic functional group present at the nitrogen containing heterocycles.

Most preferably, the nitrogen containing heterocyclic moiety is a thiazole and/or an imidazole. In particular it is preferred that the nitrogen containing heterocycles and/or their derivatives according to the present invention are selected from the group of imidazoles and/or imidazole derivatives with formula I (I)

with
$R^1$, $R^2$, $R^3$ and $R^4$ being hydrogen or aliphatic or aromatic hydrocarbons, whereas it is especially preferred that said imidazole is selected from the group of imidazole, 2-methylimidazole, 2-ethylimidazole, 2-undecylimidazole, 2-heptadecylimidazole, 2-phenylimidazole, 1,2-dimethyl imidazole, 2-ethyl-4-methylimidazole, 2-phenyl-4-methylimidazole, 1-benzyl-2-phenylimidazole, 1-benzyl-2-methylimidazole, 1-cyanoethyl-2-methylimidazole or 1-aminoethyl-2-methylimidazole.

If organic sulfonic acids are combined these are preferably selected from the group of sulfonic acids according to formula II wherein $R^5$ is preferably selected from aromatic groups, alkyl groups and fluorinated alkyl groups. In particular the organic sulfonic acid of the present invention is selected from the group of sulfonic acids according to formula III, IV, V and VI.

Furtheron it is preferred that the catalytic components of the inventive polymerisation catalyst are stable to moisture and air and most preferably also any potential further components in the polymerization catalyst are stable to moisture and air (or moisture- and air-tolerant). This allows to perform polymerization/curing reactions at lower temperature without decomposition of the catalyst-component upon exposure to moisture and air.

Another subject of the present invention is a curable composition comprising at least one polymerization catalyst according to the present invention in combination with at least one polymerizable component.

It is preferred that the curable composition can be used to form a polybenzoxazine (PBO) composition. The preferred PBO composition contains a PBO and a catalyst according to the present invention and optionally an epoxy resin and/or a phenolic resin.

An example of an epoxy resin is epoxy cresol novalac. The molding composition may include, for example, about 0.5 weight % to about 7.0 weight %, preferably about 1.5 weight % to 3.5 weight %, of the epoxy resin.

An example of a phenolic resin is phenolic novalac. The molding composition may include, for example, 0.1 weight % to 3.0 weight %, preferably 0.3 weight % to 1.5 weight %, of the phenolic resin.

In particular it is preferred, that the at least one polymerizable component according to the present invention is a benzoxazine component, in particular a component according to formula II:

(II)

wherein
$R^5$ is a linear or branched substituted or non substituted alkyl or aromatic group, preferably $R^5$ is a aromatic group;

$R^1$, $R^2$, $R^3$, $R^4$ are independently selected from hydrogen, linear or branched substituted or non substituted alkyl and aromatic group;

Whereas $R^1$ and $R^2$ or $R^2$ and $R^3$ or $R^3$ and $R^4$ can optionally form a cyclic structure.

It is preferred that if one or more of $R^1$, $R^2$, $R^3$, $R^4$, $R^5$ in benzoxazine component according to formula II are alkyl chains, these alkyl chains have a carbon number of less than 12.

In particular polybenzoxazines (PBO) can be used, to provide a coating on electronic devices such as circuit boards and semiconductors. The preferred PBO compositions have high glass transition temperature, good electrical properties (e.g., dielectric constant), low flammability, and a near-zero percent shrinkage and expansion upon demolding, postcuring, and cooling.

Preferably in the at least one benzoxazine component according to formula II there is at least one of $R^1$, $R^2$, $R^3$, $R^4$, and $R^5$ comprising another benzoxazine structure represented as

(III)

wherein $R^{1'}$, $R^{2'}$, $R^{3'}$, $R^{4'}$, and $R^{5'}$ are independently selected from hydrogen, linear or branched substituted or non substituted alkyl group and aromatic group.

It is furtheron preferred that the inventive composition comprises at least one benzoxazine component selected from (IX)

(X)

(XI)

wherein R is a linear or branched substituted or non substituted alkyl or aromatic group and preferably R is a aromatic group;

It is furtheron a preferred composition, that the molar ratio between said one or more of the polymerizable component(s) according to the present invention and the polymerisation catalyst(s) according to the present invention is 90:10 to 99.9:0.1 preferably 95:5 to 99.5:0.5.

The benzoxazine-containing molding compositions can be prepared by any conventional methods. For example, the ingredients (including resins and other additives) can be finely ground, dry blended, densified on a hot differential roll mill, and then followed by granulation. The molding composition, as described above, can be used for coating electronic devices such as semiconductors or circuit boards. The prepared compositions can be molded by any suitable molding apparatus. An example of such an apparatus is a transfer press equipped with a multi-cavity mold. For more detail on methods for preparing molding compositions and for coating electronic devices, see U.S. Pat. No. 5,476,716.

Below there are some examples of other additives that can be included in the molding composition and the preferred ranges of their weight percent in the composition:

(1) A flame retardant such as a brominated epoxy novolac flame retardant (e.g., BREN, available from Nippon Kayaku). The preferred molding composition can contain up to 3.0 weight %, more preferably, 0.1 to 1.0 weight % of a flame retardant.

(2) A flame retardant synergist such as Sb2O5 or WO3. The preferred molding composition can contain up to 3.0 weight % more preferably, 0.25 to 1.5 weight % of a flame retardant synergist.

(3) A filler such as silica, calcium silicate, and aluminum oxide. The preferred molding composition can contain 70 to 90 weight %, more preferably, 75 to 85 weight % of a filler.

(4) A colorant such as carbon black colorant. The preferred molding composition can contain 0.1 to 2.0 weight %, more preferably, 0.1 to 1.0 weight % of a colorant.

(5) A wax or a combination of waxes such as carnauba wax, paraffin wax, S-wax, and E-wax. The preferred molding composition can contain 0.1 to 2.0 weight %, more preferably, 0.3 to 1.5 weight % of a wax.

(6) Fumed silica such as aerosil. The preferred molding composition can contain 0.3 to 5.0 weight %, more preferably, 0.7 to 3.0 weight % of fumed silica.

(7) A coupling agent such as the silane type coupling agent. The preferred molding composition can contain 0.1 to 2.0 weight %, more preferably, 0.3 to 1 0 weight % of a coupling agent.

Also preferred is a composition wherein said composition comprises at least one additional solvent, preferably selected from ethers, ketones, esters, chlorinated hydrocarbons, aromatics, amides, alcohols, in particular selected from ester-type solvents and ketone-type solvents.

When it comes to curing temperatures it is preferred that the compositions according to the present invention are curable at a temperature from 70° C. to 250° C., preferably from 100° C. to 180° C., more preferably from 100° C. to 140° C.

When it comes to curing pressures it is preferred that the compositions according to the present invention are curable at a pressure between 1 to 100 atm, preferably under atmospheric pressure.

Compositions according to the present invention preferably are comprising 20% by weight to 99.9% by weight, more preferably 40% by weight to 99.5% by weight, most preferably 50% by weight to 99% by weight of one or more of the accordingly included polymerizable component(s) relative to the total composition. In this context the present invention understands the added weight values of all benzoxazine components in the composition.

A further subject of the present invention is a copolymerization and/or a polymerization product which is achievable by curing of a composition according to the present invention.

Preferably the copolymerization and/or a polymerization product according to the present invention comprises at least one polymerization catalyst according to the present invention.

A copolymerization and/or a polymerization product according to the present invention can preferably be produced by usage of a range of curing temperature from 70° C. to 250° C., preferably from 100° C. to 180° C., more preferably from 100° C. to 140° C.

In a preferred embodiment a composition and/or a copolymerization and/or a polymerization product according to the present invention is in the form of an adhesive, in which case one or more of an adhesion promoter, a flame retardant, a filler, a thermoplastic additive, a reactive or non-reactive diluent, and a thixotrope might be included. In addition, such an inventive adhesive may be placed in film form, in which case a support constructed from nylon, glass, carbon, polyester, polyalkylene, quartz, polybenzimidazole, polyetheretherketone, polyphenylene sulfide, poly p-phenylene benzobisoaxazole, silicon carbide, phenolformaldehyde, phthalate and napthenoate may be included.

The inventive compositions and/or a copolymerization and/or a polymerization products (and pregregs and towpregs prepared therfrom) are particularly useful in bonding of composite and metal parts, core and core-fill for sandwich structures and composite surfacing, and in the manufacture and assembly of composite parts for aerospace and industrial end uses, such as matrix resins for fiber reinforced composite articles, as matrix resins for use in prepregs, or as matrix resins in advanced processes, such as resin transfer molding and resin film infusion.

It is a further object of the present invention to make use of at least one polymerization catalyst according to the present invention, whereas it is preferred that the at least one catalyst as well as any potential further catalysts are stable to moisture and air, in curable compositions comprising at least one benzoxazine component, which in a preferred embodiment is covered by formula II:

(II)

wherein
$R^5$ is a linear or branched substituted or non substituted alkyl or aromatic group, preferably $R^5$ is a aromatic group;
$R^1$, $R^2$, $R^3$, $R^4$ are independently selected from hydrogen, linear or branched substituted or non substituted alkyl and aromatic group;
Whereas $R^1$ and $R^2$ or $R^2$ and $R^3$ or $R^3$ and $R^4$ can optionally form a cyclic structure.

It is preferred that if one or more of $R^1$, $R^2$, $R^3$, $R^4$, $R^5$ in benzoxazine component according to formula II are alkyl chains, these alkyl chains have a carbon number of less than 12.

In particular polybenzoxazines (PBO) can be used, to provide a coating on electronic devices such as circuit boards and semiconductors. The preferred PBO compositions have high glass transition temperature, good electrical properties (e.g., dielectric constant), low flammability, and a near-zero percent shrinkage and expansion upon demolding, postcuring, and cooling.

In another preferred embodiment of the inventive use according to the present invention in the at least one benzoxazine component according to formula II there is at least one of $R^1$, $R^2$, $R^3$, $R^4$, and $R^5$ comprising another benzoxazine structure represented as

(III)

wherein $R^{1'}$, $R^{2'}$, $R^{3'}$, $R^{4'}$, and $R^{5'}$ are independently selected from hydrogen, linear or branched substituted or non substituted alkyl group and aromatic group.

It is furtheron preferred according to the inventive use that the curable composition comprises at least one benzoxazine component selected from (IX)

wherein R is a linear or branched substituted or non substituted alkyl or aromatic group and preferably R is a aromatic group;

It is furtheron a preferred inventive use, if the molar ratio between said at least one benzoxazine component(s) according to the present invention and the polymerisation catalyst(s) according to the present invention is 90:10 to 99.9:0.1 preferably 95:5 to 99.5:0.5.

The benzoxazine-containing molding compositions can be prepared by any conventional methods. For example, the ingredients (including resins and other additives) can be finely ground, dry blended, densified on a hot differential roll mill, and then followed by granulation. The molding composition, as described above, can be used for coating electronic devices such as semiconductors or circuit boards. The prepared compositions can be molded by any suitable molding apparatus. An example of such an apparatus is a transfer press equipped with a multi-cavity mold. For more detail on methods for preparing molding compositions and for coating electronic devices, see U.S. Pat. No. 5,476,716.

Below there are some examples of other additives that can be included in the molding composition and the preferred ranges of their weight percent in the composition:
(1) A flame retardant such as a brominated epoxy novolac flame retardant (e.g., BREN, available from Nippon Kayaku). The preferred molding composition can contain up to 3.0 weight %, more preferably, 0.1 to 1.0 weight % of a flame retardant.
(2) A flame retardant synergist such as Sb2O5 or WO3. The preferred molding composition can contain up to 3.0 weight %, more preferably, 0.25 to 1.5 weight % of a flame retardant synergist.
(3) A filler such as silica, calcium silicate, and aluminum oxide. The preferred molding composition can contain 70 to 90 weight %, more preferably, 75 to 85 weight % of a filler.
(4) A colorant such as carbon black colorant. The preferred molding composition can contain 0.1 to 2.0 weight %, more preferably, 0.1 to 1.0 weight % of a colorant.
(5) A wax or a combination of waxes such as carnauba wax, paraffin wax, S-wax, and E-wax. The preferred molding composition can contain 0.1 to 2.0 weight %, more preferably, 0.3 to 1.5 weight % of a wax.
(6) Fumed silica such as aerosil. The preferred molding composition can contain 0.3 to 5.0 weight %, more preferably, 0.7 to 3.0 weight % of fumed silica.
(7) A coupling agent such as the silane type coupling agent. The preferred molding composition can contain 0.1 to 2.0 weight %, more preferably, 0.3 to 1 0 weight % of a coupling agent.

Also preferred is an inventive use wherein additionally to said at least one benzoxazine component(s) according to the present invention there is at least one additional solvent, preferably selected from ethers, ketones, esters, chlorinated hydrocarbons, aromatics, amides, alcohols, in particular selected from ester-type solvents and ketone-type solvents.

When it comes to curing temperatures it is preferred that the curable composition according to the present invention is curable at a temperature from 70° C. to 250° C., preferably from 100° C. to 180° C., more preferably from 100° C. to 140° C.

When it comes to curing pressures it is preferred that the curable composition according to the present invention is curable at a pressure between 1 to 100 atm, preferably under atmospheric pressure.

In the composition to be applied in the inventive use it is preferred to have one or more of the accordingly benzoxazine components in a concentration from 20% by weight to 99.9% by weight, more preferably 40% by weight to 99.5% by weight, most preferably 50% by weight to 99% by weight relative to the total composition. In this context the present invention understands the added weight values of all benzoxazine components in the composition.

Preferably the final compositions for the inventive use comprise additional components selected from the groups of inorganic fillers preferably silica powder, powdery metal oxide, and powdery metal or organic fillers preferably rubber particle and other polymer particles.

It is a further subject of the present invention to use curable compositions according to the present invention or a copolymerization and/or a polymerization products according to the present invention achievable from those inventive compositions, in the preparation of and/or as sealants, adhesives and/or coatings, preferably in electronic chip bonding and electronic chip underfills, whereby the sealants, adhesives and/or coatings are preferably applied to and hardened on or between substrates selected from the group comprising metals, silicates, metal oxides, concrete, wood, electronic chip material, semiconductor material and organic polymers.

In particular the curable compositions according to the present invention or a copolymerization and/or a polymerization product according to the present invention achievable from those inventive compositions are used for a variety of applications including adhesive and molded applications. Preferably the inventive use is directed to the application as adhesives where their low flammability is important (e.g. airplane interiors etc.) or where their thermal stability and easily modified physical properties such as modulus, tensile strength, and coefficient of expansion would be of value. As mentioned they could also be used in filled or unfilled molding applications, as matrix resins for fiber reinforced composite articles, as matrix resins for use in prepregs, or as matrix resins in advanced processes, such as resin transfer molding and resin film infusion.

A further subject of the present invention is a method of coating a device by heating a composition according to the present invention to a temperature sufficient to cure the composition, which preferably comprises a benzoxazine monomer, thus forming a polymer which coats a surface of the device, which is preferably an electronic device such as a semiconductor or a circuit board.

A further subject of the present invention is a device coated with a copolymerization and/or a polymerization product according to the present invention. Also the coating itself is a subject of the present invention.

In a preferred embodiment the device can be an electronic device such as a semiconductor or a circuit board.

The present invention is exemplified in more detail by means of Examples, which follow below.

EXAMPLES

I.) A First Series of Examples

General Description for the Following Examples

Figure 1:
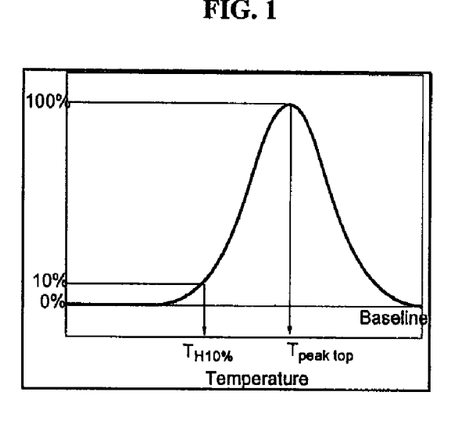
FIG. 1 shows the temperature of the peak top ($T_{peak\ top}$) and 10% heat evolution temperature ($T_{H10\%}$).

A benzoxazine monomer and a polymerization catalyst (2.5 mol % related to benzoxazine moiety) were mixed. Approximately 10 mg of the mixture were put on an aluminium pan and set in a differential scanning calorimeter (DSC). The DSC profile for the curing reaction was measured with a heating rate of 10° C./min under nitrogen atmosphere. From the resulting DSC profile, temperature for the peak top ($T_{peak\ top}$) and 10% heat evolution temperature ($T_{H10\%}$: This temperature can be more clearly determined than onset temperature, which is usually used for judgement of curing reaction but sometimes difficult to determine) were determined as shown in FIG. 1. The catalysts were tested according to this procedure and the corresponding values of $T_{H10\%}$ and $T_{peak\ top}$ were listed in Table 1.

Example 1

As explained 2.5 mol % of a manganese catalyst 1a related to benzoxazine moiety monomer 2 were mixed to obtain a homogeneous mixture. About 10 mg of the mixture was analyzed by DSC.

1a

2

Example 2

The iron catalyst 1b and the benzoxazine monomer 2, were mixed to obtain a homogeneous mixture. About 10 mg of the mixture was analyzed by DSC.

Example 3

The cobalt catalyst 1c and the benzoxazine monomer 2 were mixed to obtain a homogeneous mixture. About 10 mg of the mixture was analyzed by DSC.

TABLE 1

| | catalyst | $T_{H10\%}$ | $T_{peak\ top}$ |
|---|---|---|---|
| Example 1 | 1a | 128 | 192 |
| Example 2 | 1b | 141 | 201 |
| Example 3 | 1c | 116 | 194 |

In every case, $T_{H10\%}$ was below ca. 140° C.

Comparative Examples

Conventional catalysts were used instead of the newly invented catalysts. The used benzoxazine monomer was the same as in the above described inventive examples: 2. The tests were performed according to the same procedure as for the inventive examples. That means that approximately 2.5 mol % of the selected catalyst related to the benzoxazine monomer was used and the components were mixed to get a homogeneous mixture. Approximately 10 mg of the mixture were put on an aluminium pan and set in a differential scanning calorimeter (DSC). The results are listed in Table 2.

TABLE 2

Results according to the referential examples

| | catalyst | $T_{10\%}$ | $T_{peak\ top}$ |
|---|---|---|---|
| Comparative example 1 | no catalyst | 253 | 263 |
| Comparative example 2 | Dibutyltin dilaurate | 243 | 255 |
| Comparative example 3 | Ethyltriphenylphosphonium iodide | 237 | 250 |
| Comparative example 4 | 4-ethyl-2-methylimidazole | 209 | 235 |
| Comparative example 5 | 1,8-Diazabicyclo[5.4.0]undec-7-ene | 203 | 219 |
| Comparative example 6 | p-toluenesulfonic acid | 179 | 212 |
| Comparative example 7 | Vanadium (III) aetylacetonate | 181 | 224 |
| Comparative example 8 | Cromium (III) acetylacetonate | 215 | 238 |
| Comparative example 9 | Manganese (III)acetylacetonate | 183 | 210 |
| Comparative example 10 | Manganese (II) acetylacetonate | 181 | 209 |
| Comparative example 11 | Iron (III) acetylacetonate | 168 | 203 |
| Comparative example 12 | Cobalt (II) acetylacetonate | 191 | 216 |
| Comparative example 13 | Nickel (II) acetylacetonate | 224 | 242 |
| Comparative example 14 | Copper (II) acetylacetonate | 227 | 244 |
| Comparative example 15 | Zinc (II) acetylacetonate | 194 | 217 |

Among these catalysts, p-toluenesulfonic acid and Iron (III) acetylacetonate exhibited high catalytic activities. However, $T_{H10\%}$ was still about or higher than approximately 170° C. Compared to these results, the $T_{H10\%}$ values achieved in the Examples according to the present invention were surprisingly low. This is an exceptional effect, which could not be expected from the state of the art.

II.) A Second Series of Examples

Description of the Second Series of Examples

A benzoxazine monomer 3 was mixed together with a catalyst (1 mol % to 3) in a test tube at 50° C. Afterwards the resulting homogeneous mixture was divided into 5 portions. These portions were placed in test tubes individually, which were heated at 150° C. in an oil bath.

3a: R = Ph
3b: R = Me 1 mol % Catalyt
150° C.

PTS
or

1a

After 0.5 h, 1 h, 1.5 h, and 2 h, the test tubes were taken out of the bath one after one, and the probe was analyzed by $^1$H-NMR to determine the quantity of monomer conversion at the corresponding duration of heat treatment. An experiment according to this description was performed first with a catalyst according to the present invention (1a) and in a later experiment with p-toluenesulfonic acid (PTS) as a conventional catalyst as well as without catalyst at all.

The corresponding time conversion relationship is illustrated in FIG. 1.

Figure 2:
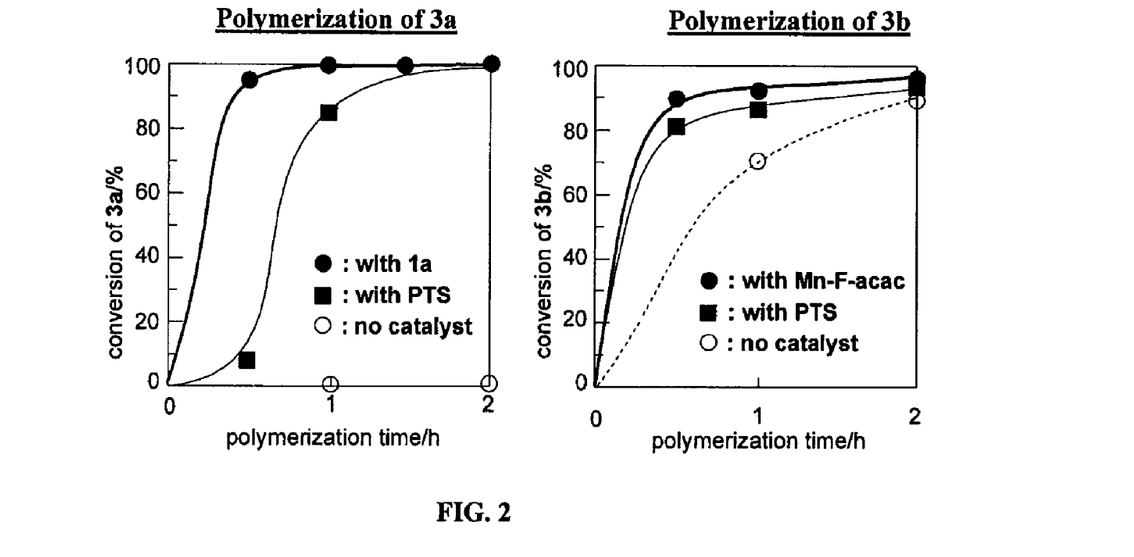
FIG. 2 shows a corresponding time-conversion relationship of the polymerization of benzoxazine monomers 3a and 3b.

As can be seen from the results documented in FIG. 2, the manganese catalyst 1a exhibited remarkably higher catalytic activity than PTS.

III.) A Third Series of Examples

Description of the Third Series of Examples

A benzoxazine monomer 3b was mixed together with a catalyst (1 mol % to 3) in a test tube at 50° C. Afterwards the resulting homogeneous mixture was divided into 2 portions and placed in test tubes individually. One of these test tubes was treated for 5 hours at 100° C. in an oil bath. The other one was treated for 5 hours at 120° C. in an oil bath.

3b 1 mol % Catalyt
100° C. or 120° C.

-continued

1a

The resulting probe was analyzed by $^1$H-NMR to determine the quantity of monomer conversion after 5 hours heat treatment. An experiment according to this description was performed first with a catalyst according to the present invention (1a) and in a later experiment with p-toluenesulfonic acid (PTS) as a conventional catalyst.

The corresponding time-conversion relationship is illustrated in table 3.

TABLE 3

Time-conversion relationship of the monomer 3b in dependence of temperature and type of catalyst:

| | Catalyst | Conversion of 3b at 100° C., at 5 h | Conversion of 3b at 120° C., at 5 h |
|---|---|---|---|
| Reference | PTS | 73% | 80% |
| Example | Mn-F-acac 1a | 84% | 89% |

The invention claimed is:

1. A curable composition comprising a polymerization catalyst according to formula I wherein n=1, 2, 3 or 4, $E^1$ and $E^2$ are electron withdrawing substituents, R is a member selected from the group consisting of a hydrogen, and a linear or branched substituted or non substituted alkyl group with 1 to 20 C-atoms, an aryl-group, an hydroxyl-group, an ether bridged alkyl chain or halogen, and Metal is a member selected from the group of all metals which are capable of forming metal:ligand complexes and

$2x+1=y+z$ and $z>y$, and $2x'+1=y'+z'$ and $z'>y'$;

and at least one polymerizable benzoxazine component.

2. A composition according to claim 1, wherein the at least one catalyst as well as any potential further catalysts are stable to moisture and air (or moisture- and air-tolerant).

3. A composition according to claim 1, wherein the at least one polymerizable benzoxazine component is represented by formula II:

wherein $R^5$ is a linear or branched substituted or non substituted alkyl or aromatic group;

$R^1$, $R^2$, $R^3$, and $R^4$ are independently selected from hydrogen, linear or branched substituted or non substituted alkyl and aromatic group;

and $R^1$ and $R^2$, $R^2$ and $R^3$ or $R^3$ and $R^4$ can optionally form a cyclic structure.

4. A composition according to claim 3, wherein there is at least one benzoxazine component according to formula II with at least one of $R^1$, $R^2$, $R^3$, $R^4$, and $R^5$ comprising another benzoxazine structure represented as wherein $R^{1'}$, $R^{2'}$, $R^{3'}$, $R^{4'}$, and $R^{5'}$ are independently selected from hydrogen, linear or branched substituted or non substituted alkyl group and aromatic group.

5. A composition according to claim 1, wherein the polymerizable benzoxazine component is selected from the group consisting of -continued wherein R is a linear or branched substituted or non substituted alkyl or aromatic group.

6. A composition according to claim 1, wherein the molar ratio between the at least one benzoxazine component and the at least one catalyst represented by formula I is 90:10 to 99.9:0.1.

7. A composition according to claim 1, wherein said composition comprises at least one additional solvent selected from the group consisting of ethers, ketones, esters, chlorinated hydrocarbons, aromatics, amides, and alcohols.

8. A composition according to claim 7, wherein said solvent is selected from ester solvents and ketone solvents.

9. A composition according to claim 1, wherein said composition is curable at a temperature from 70° C. to 250° C.

10. A composition according to claim 1, wherein said composition is curable at a pressure between 1 to 100 atm.

11. A composition according to claim 1, wherein the polymerizable benzoxazine component is present in an amount of 20% by weight to 99.9%.

12. A copolymerization and/or a polymerization product achievable by curing of a composition according to claim 1.

13. Method of coating a device by heating a composition according to of claim 1 to a temperature sufficient to cure the composition, thus forming a polymer which coats a surface of the device.

14. Device coated with a copolymerization and/or a polymerization product according to claim 12.

* * * * *